US009443490B2

(12) United States Patent
Ward et al.

(10) Patent No.: US 9,443,490 B2
(45) Date of Patent: Sep. 13, 2016

(54) SELECTIVE DISPLAY OF WAVEFORMS GOVERNED BY MEASURED PARAMETERS

(75) Inventors: Benjamin A. Ward, Portland, OR (US); Kenneth P. Dobyns, Beaverton, OR (US); Gary J. Waldo, Hillsboro, OR (US)

(73) Assignee: TEKTRONIX, INC., Beaverton, OR (US)

( * ) Notice: Subject to any disclaimer, the term of this patent is extended or adjusted under 35 U.S.C. 154(b) by 460 days.

(21) Appl. No.: 13/538,978

(22) Filed: Jun. 29, 2012

(65) Prior Publication Data

US 2014/0002508 A1 Jan. 2, 2014

(51) Int. Cl.
*G01R 23/00* (2006.01)
*G09G 5/10* (2006.01)
*G09G 5/00* (2006.01)

(52) U.S. Cl.
CPC *G09G 5/10* (2013.01); *G09G 5/00* (2013.01); *G09G 2320/0271* (2013.01)

(58) Field of Classification Search
CPC .... G01R 13/345; G01R 13/00; G01R 13/26; G01R 13/0272; G01R 13/0236; G01R 13/029; G01R 13/30; G01R 13/22; G01R 13/32; G01R 23/16; G01R 23/173; G01R 23/00; G01R 23/165; G01R 27/28; G01R 19/04
USPC ......... 324/121 R, 76.19–76.38, 76.41–76.48, 324/76.52–76.62, 76.11–76.13, 76.18
See application file for complete search history.

(56) References Cited

U.S. PATENT DOCUMENTS

| | | | | |
|---|---|---|---|---|
| 4,085,367 | A * | 4/1978 | Williams et al. | 324/76.13 |
| 4,980,845 | A * | 12/1990 | Putrow et al. | 701/34.3 |
| 5,603,114 | A * | 2/1997 | Tomita | 455/249.1 |
| 6,307,896 | B1 * | 10/2001 | Gumm | H04B 1/30 348/E17.003 |
| 6,344,844 | B1 * | 2/2002 | Timm et al. | 345/440.1 |
| 6,671,334 | B1 * | 12/2003 | Kuntz | H04L 7/0029 348/E17.003 |
| 6,912,247 | B2 * | 6/2005 | Miyashita | H04L 1/24 324/76.14 |
| 7,170,929 | B2 * | 1/2007 | Miyashita | H04L 1/24 375/228 |
| 7,170,955 | B2 * | 1/2007 | Astrachan | 375/343 |
| 7,509,670 | B1 * | 3/2009 | Naegeli | H04N 7/17309 725/124 |
| 7,929,933 | B2 * | 4/2011 | Gozen | 455/226.2 |
| 2003/0085925 | A1 * | 5/2003 | Bernard et al. | 345/764 |
| 2003/0090595 | A1 * | 5/2003 | Vilard et al. | 348/626 |
| 2005/0057253 | A1 * | 3/2005 | Gee | G01R 13/02 324/409 |
| 2005/0213689 | A1 * | 9/2005 | Matsuda et al. | 375/324 |
| 2007/0297537 | A1 * | 12/2007 | Luce | H04L 27/0014 375/322 |
| 2010/0239104 | A1 * | 9/2010 | Iser | G10L 21/0208 381/94.2 |
| 2011/0103452 | A1 * | 5/2011 | Park et al. | 375/228 |
| 2013/0223572 | A1 * | 8/2013 | Cheng et al. | 375/340 |

* cited by examiner

*Primary Examiner* — Tung X Nguyen
*Assistant Examiner* — Thang Le
(74) *Attorney, Agent, or Firm* — Thomas F. Lenihan; Marger Johnson

(57) ABSTRACT

Disclosed is a test and measurement instrument that includes a signal input structured to receive a modulated radio frequency (RF) signal under test and a demodulator structured to extract a digital signal from the received modulated RF signal. The extracted digital signal has a measurable parameter. The instrument also includes a display controller structured to display the extracted demodulated signal at one of at least two different intensities based on the measured parameter of the digital signal. In other embodiments the signal need not be an RF signal. Methods of operation are also described.

17 Claims, 8 Drawing Sheets

SELECTIVE DISPLAY OF WAVEFORMS GOVERNED BY MEASURED PARAMETERS

FIELD OF THE INVENTION

This disclosure is related to test and measurement instruments, and, more particularly, to test and measurement instruments that automatically selectively display information.

BACKGROUND

Test and measurement devices, such as oscilloscopes and spectrum analyzers, for instance, accept input signals and display them or other data or signals derived from them on a display for viewing and analysis by a user.

For instance, signals such as Radio Frequency (RF) signals may be modulated with a digital signal to create a modulated RF signal capable of carrying data from a source to a destination. One method of deriving the original digital signal from the modulated RF signal is by demodulating the RF signal. If desired, the original data used to make the digital signal may also be reconstructed from the demodulated digital signal.

Two widely used schemes for encoding the digital signal into an RF signal are phase modulation (PM) and frequency modulation (FM), using widely known methods such as phase shift keying (PSK) and frequency shift keying (FSK), respectively. In those examples, to make an RF signal that carries the digital signal, the digital signal (or a smooth-filtered version of the digital signal) is modulated using PSK or FSK along with a carrier wave into the resultant modulated RF signal. Later, the receiving device de-modulates the received RF signal and extracts the previously encoded digital signal. In a test and measurement device, the decoded digital signal is typically shown on the display. Additionally, data from the digital signal may be generated and stored. Viewing the modulating digital signal waveform and subsequent effects of the circuitry and channel through which the data passed is very helpful, especially when testing and measuring data communication equipment.

A problem exists, however, when the test and measurement device attempts to decode an RF signal that is not carrying data. Oftentimes data is placed on an RF signal in bursts, where data is present during data bursts and not present at other times. When the test and measurement device attempts to display the demodulated digital signal but no data is present, the device shows such a condition as noise. Phase detection of noise, when no data is present, produces a random phase between +/−180°, and frequency demodulation of noise yields random frequencies. This displayed noise makes it difficult for users of test and measurement devices to effectively extract useful information from the display screen.

Embodiments of the invention address these and other limitations of the prior art.

SUMMARY OF THE INVENTION

Some embodiments of the invention are directed toward a test and measurement instrument. The instrument includes a signal input structured to receive a modulated radio frequency (RF) signal under test and a demodulator structured to extract a digital signal from the received modulated RF signal. The extracted digital signal has a measurable parameter. The instrument also includes a display controller structured to display the extracted demodulated signal at one of at least two different intensities based on the measured parameter of the digital signal.

In other embodiments the signal need not be an RF signal. In these embodiments the instrument includes a demodulator structured to extract a time-dependent signal from the signal to be evaluated, the time-dependent signal having a measurable parameter. The display controller is then structured to display the time-dependent signal at one of at least two different intensities based on the measured parameter of the time-dependent signal.

Another embodiment includes a method in a test and measurement device. The method includes receiving an input signal at the test and measurement device, then demodulating the input signal to extract a demodulated, time-dependent data signal. Next the method determines a parameter of the demodulated, time-dependent data signal, and selectively displays the demodulated data signal at one of two or more intensity levels dependent on the determined parameter level.

DETAILED DESCRIPTION

Embodiments of this invention provide enhanced data display techniques and data gathering capabilities of demodulated signals in a test and measurement device, such as in a Real-Time Spectrum Analyzer (RTSA) or oscilloscope.

Figure 1:
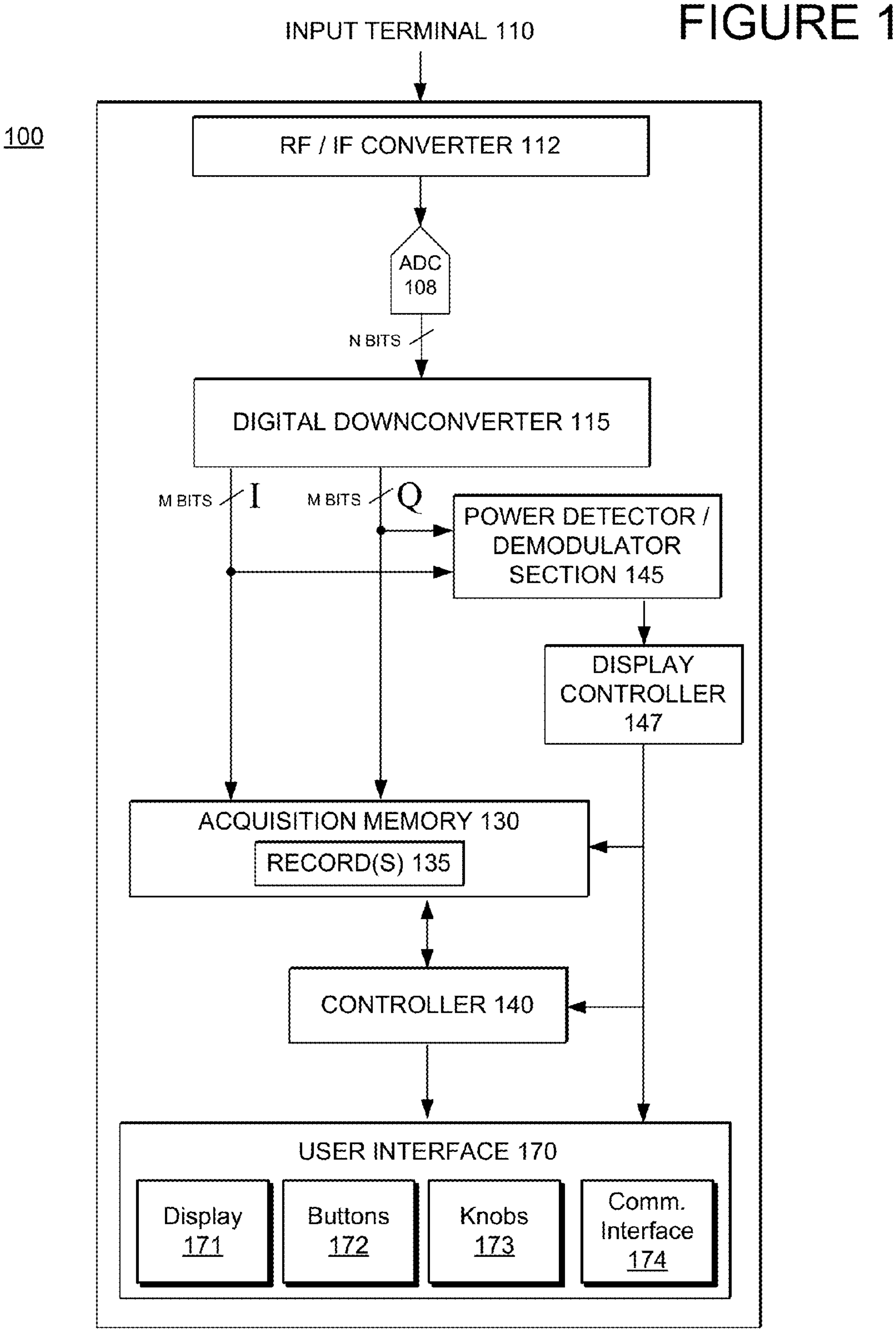
FIG. 1 is a functional block diagram of a test and measurement instrument including a power detector that operates on demodulated data according to embodiments of the invention.

FIG. 1 illustrates a block diagram of a test and measurement instrument 100 according to embodiments of the invention including an RF/IF converter 112, ADC 108, a digital downconverter 115, an acquisition memory 130 to store one or more records 135, a power detector/demodulator section 145, display controller 147, a controller 140, and a user interface 170, which itself includes a display 171, user controls such as buttons 172 and knobs 173, and a communication interface 174.

The test and measurement instrument 100 is preferably a digital spectrum analyzer such as an RTSA, or an oscilloscope, or other suitable measurement device. For the sake of brevity and consistency, but not limitation, the test and measurement instrument will generally be referred to herein as a signal analyzer.

The signal analyzer 100 may have one or more channels or inputs, such as input terminal 110, suitable for use with various embodiments as described herein. The input terminal 110 can receive signals having a frequency, for example, of between DC to 20+ GHz. Although the signal analyzer 100 may have a single input terminal 110, other embodiments may have multiple inputs. Further, while various components of the signal analyzer 100 are shown to be coupled to one another for ease of illustration, various embodiments may include a variety of other circuit or software components, inputs, outputs, and/or interfaces, which are not necessarily shown, but that are disposed between or otherwise associated with the illustrated components of signal analyzer 100.

An electrical signal under test, is received at the input terminal 110. The signal under test may be any signal, for example a signal that includes or may be converted to a signal that includes time-domain components. Although the below embodiments are described generally with reference to Radio Frequency (RF) signals, any type of signal type under analysis may benefit from embodiments of the invention.

The RF signal can be converted to an analog intermediate frequency (IF) signal by the RF/IF converter 112, which can filter the signal prior to being digitized by an Analog to Digital Converter (ADC) 108. The digital downconverter 115 can produce I and Q baseband component information from the digitized IF signal. However, reference herein will generally be made to an "RF signal" or "RF signals" and it should be understood that such reference can include one or more RF signal, or, one or more IF signal derived from the RF signal.

The ADC 108 is structured to digitize the RF signal under test. The digital downcoverter 115 is operatively coupled to the ADC 108, receives the digitized RF signal, and produces I (in-phase) and Q (quadrature) baseband component information from the digitized RF signal. More specifically, the downconverter 115 can numerically multiply a sine and cosine with the digitized RF signal, thereby generating the I and Q component information, which contains all of the information present in the original RF signal.

The I and Q component information is transmitted to a power detector/demodulator section 145, described below, which also can process the information in real-time. Although for clarity and brevity the detector 145 is referred to as a power detector, it may, in fact, detect or measure different or additional parameters other than power, such as magnitude, or an amplitude of a signal.

Each of the I and Q component information can be transmitted over multiple lines corresponding to M bits of information, as illustrated in FIG. 1. In addition, the section 145 produces IQ-based time-domain traces, such as phase-versus-time and/or frequency-versus-time traces, which may be processed by the display controller 147 for further display on the display 171. The terms "trace" and "traces" should be understood broadly to include any information or data, which can be stored, and/or plotted on a display device, and can convey information to a user about a received signal, a derived signal, or a generated signal.

In a generic embodiment, the display controller 147 may be used to suppress display of noise on the display 171 during periods of time when the RF signal does not contain modulated data. Other embodiments generate a waveform on the display 171 that is proportional to the parameter measured by the detector 145. Further examples, along with additional details of operation are described below.

An acquisition memory 130 is operatively coupled to the digital downconverter 115 and is configured to acquire and store one or more records 135 of the digitized I and Q baseband component information or other information associated with the RF signal. Each input terminal 110 of the signal analyzer may have separate memory locations or records 135 in which the component information is stored. The acquisition memory 130 can be any variety of suitable memory.

In some embodiments, the power detector/demodulator section 145 may additionally be used to label data stored in the acquisition memory 130. For example, the detector may label data stored in the memory 130 as invalid during periods when no data is demodulated from the RF signal. As described below, information gathered by the power detector/demodulator 145 may be used to mark the information stored in the acquisition memory 130 representing these times as invalid, or as containing non-data. Alternatively, information gathered by the power detector/demodulator 145 may be used to suppress storing of data in the acquisition memory 130 during these times.

The signal analyzer 100 includes a controller 140 that can be operatively coupled to the acquisition memory 130, and can access and/or process the I and Q baseband component information from the acquisition memory 130. The controller 140 can access and/or process the acquired data either during or subsequent to the actual acquisition of the data. The controller 140 is also coupled to the user interface 170 and may be used to produce corresponding waveforms or spectra for display by the display 171. Further, the controller 140 may generate these waveforms in conjunction with the display controller 147, as described below.

Any of the RF/IF converter 112, the ADC 108, the digital downconverter 115, the power detector/demodulator section 145, the display controller 147, the acquisition memory 130, the controller 140, and the user interface 170 may exist in or be implemented using hardware, software, firmware, or by any combination thereof.

Figure 2:
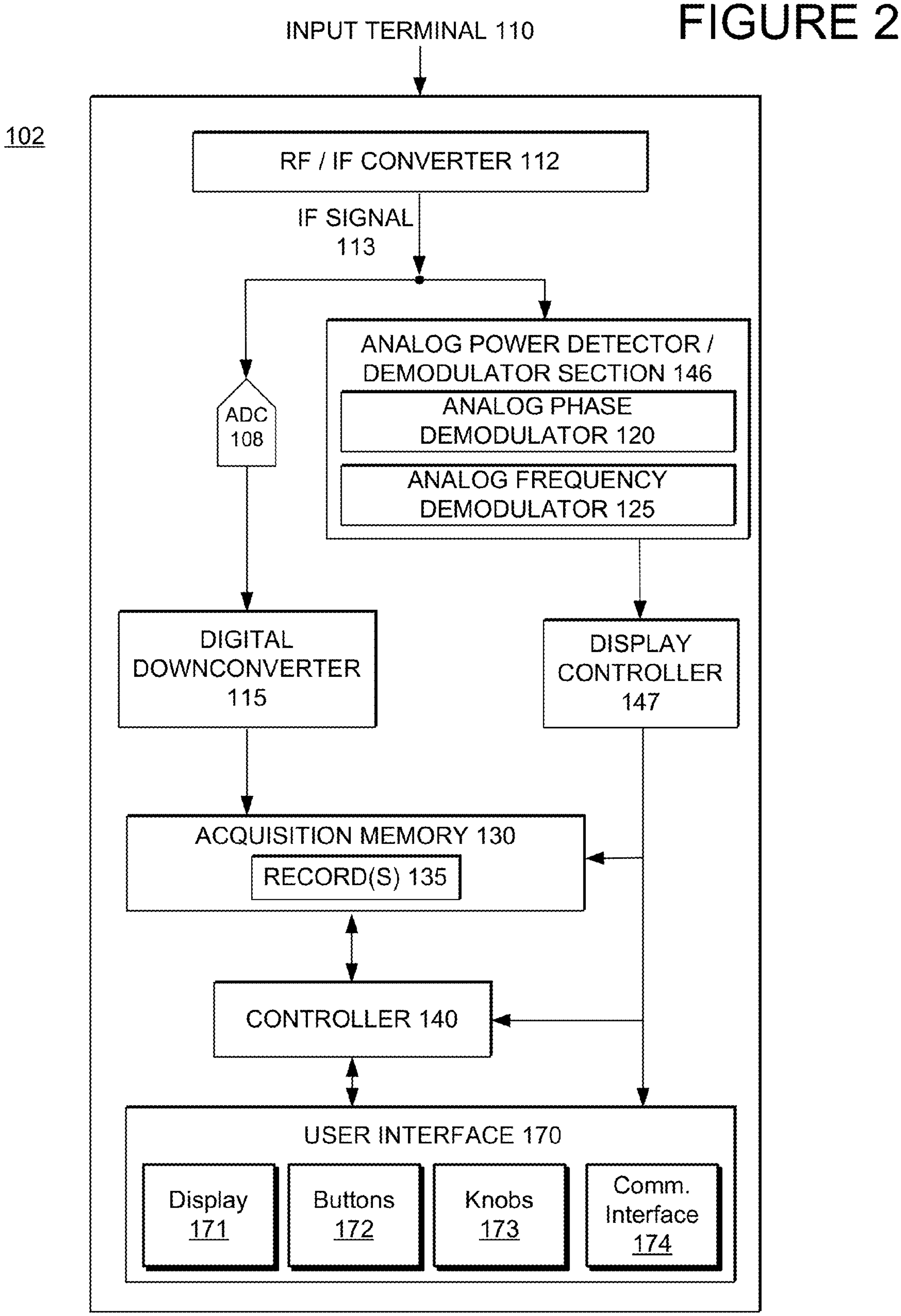
FIG. 2 is a functional block diagram of a test and measurement instrument including a power detector that operates on analog signal data according to embodiments of the invention.

FIG. 2 illustrates a block diagram of a test and measurement instrument 102 similar to the signal analyzer 100 illustrated in FIG. 1, but including an analog power detector/demodulator section 146, which operates on an analog signal IF signal 114 rather than the output of the digital downconverter 115 as in FIG. 1.

In the signal analyzer 102, an analog power detector/demodulator section 146 can receive the IF signal 114 from the RF/IF converter 112, and determine a power level or other measured parameter of the IF signal. The analog power detector/demodulator section 146 can produce a display modifying signal for use by the display controller 147 based on the measured parameter.

Figure 3:
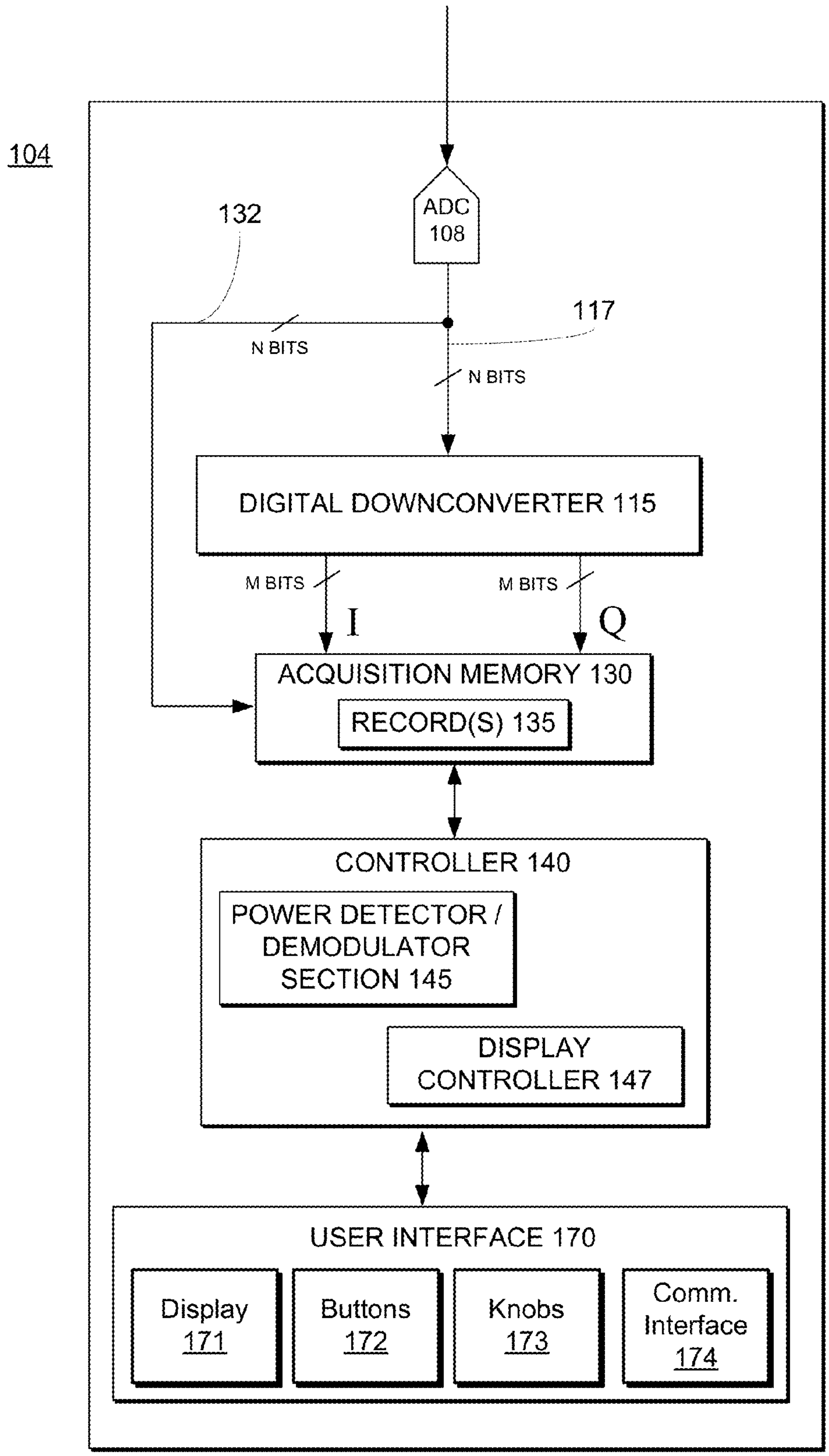
FIG. 3 is a functional block diagram of a test and measurement instrument including a controller that further includes a parameter detector, such as a power detector, according to embodiments of the invention.

FIG. 3 illustrates a block diagram of a test and measurement instrument 104 similar to the signal analyzer 102 of FIG. 1 and to the signal analyzer 102 of FIG. 2. Of note, however, is line 132, which directly connects the output of the ADC 108 to the acquisition memory 130 over multiple lines corresponding to N bits of information, as illustrated in FIG. 3. The information received over line 132 can include digitized RF signal information, which can be later processed, for example, using the downconverter 115 and/or the controller 140.

As a further difference, in this embodiment the power detector/demodulator section 145 may be included within the controller 140, and may process information received from the acquisition memory 130. As described above, the display controller 147 may be used to modify how a waveform is displayed on the display 171 depending on the output of the power detector/demodulator section 145.

Figure 4:
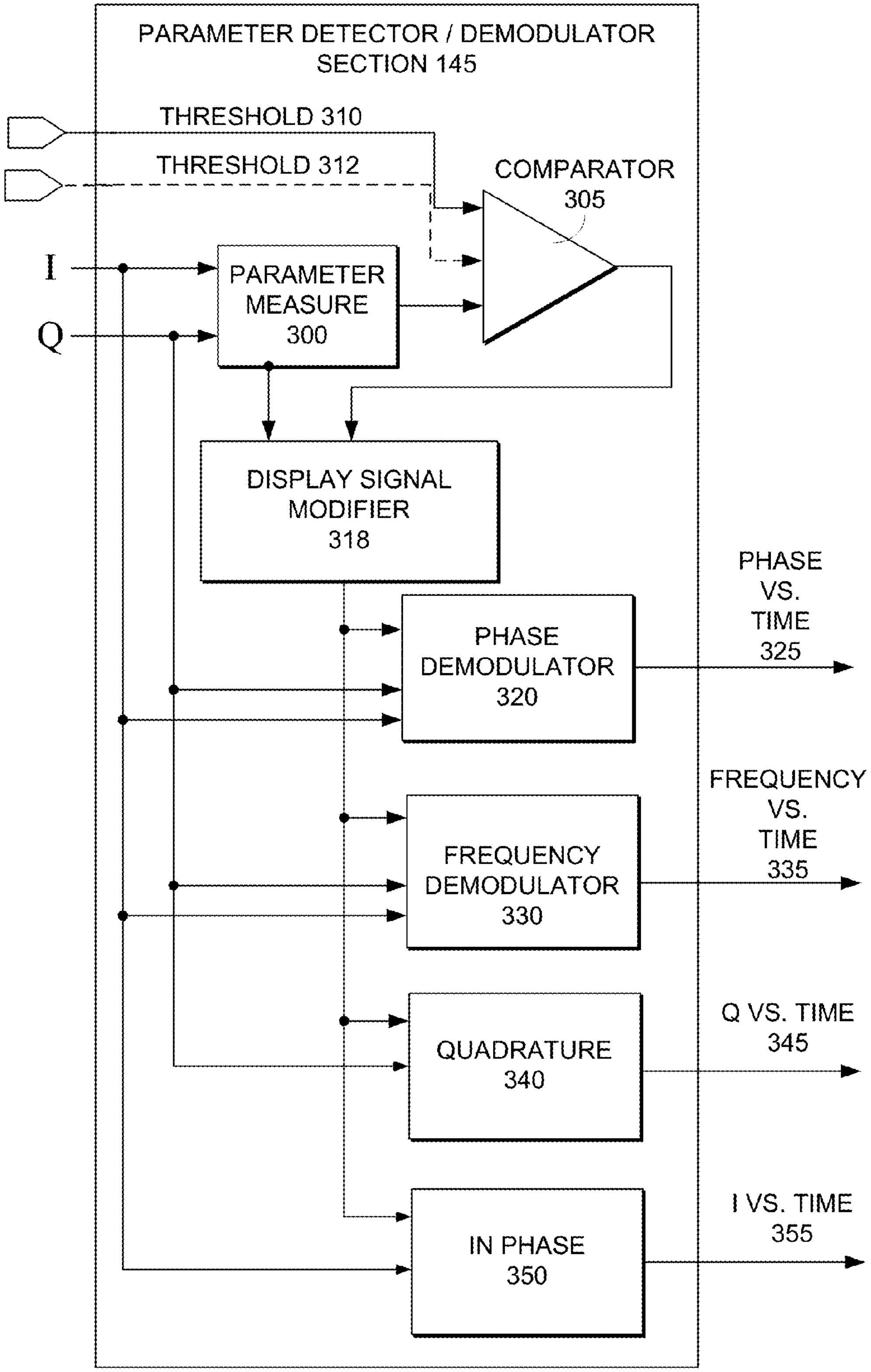
FIG. 4 is a functional block diagram of a parameter detector according to embodiments of the invention.

FIG. 4 is a block diagram of the power detector/demodulator section 145 of FIGS. 1-3 in accordance with an example embodiment of the invention. In many modern communication systems, signals such as RF signals are not on all of the time. Rather, a signal is pulsed on, information is communicated, and then the signal is turned off. A problem exists, however, when an RF signal is demodulated when it contains no data, or at other times when displaying time-based data or waveforms on the display 171. More specifically, invalid or unwanted data is oftentimes shown on the display that does not help the user, and, in fact, may detract from the user experience.

Embodiments of the invention address these problems by selectively displaying particular data and/or waveforms on the display 171. In some embodiments, unwanted data is simply not shown. In other embodiments unwanted data may be shown dimly, while important data is shown brighter or at full intensity. Full intensity may mean an intensity at which other data are shown on a display 171. Full intensity may also mean relatively bright. In other embodiments intensity of the shown data or waveforms is shown dependent on a measured parameters. Measured parameters may include, for example and without limitation, an amplitude of a signal, such as a demodulated signal. Another measured parameter may include the measured power of a signal. Another parameter may include a magnitude of I and Q outputs of a downconverted signal.

With reference back to FIG. 4, in some embodiments a parameter measure 300 measures one or more parameters of or from the I and Q signals and provides the measure to a display signal modifier 318. In a simple embodiment, the measured parameter is used by the display signal modifier 318 to directly control an intensity of data or a waveform when it is shown on the display 171 in the form of a phase vs. time output 325, a frequency vs time output 335, a Q vs. time output 345, or an I vs. time output 355 generated by a phase demodulator output generator 320, frequency demodulator output generator 330, quadrature output generator 340, or an in-phase output generator 350, respectively. Other data or waveform outputs may also benefit from embodiments of the invention. For example, when the output signal has a relatively high amplitude, the output signal is displayed with a proportionally relatively high intensity, and when the output signal has a relatively low amplitude, the output signal is displayed with a relatively low intensity.

Other embodiments may include the use of a comparator 305 to implement a "squelch" function. In this mode, data or a waveform that would otherwise be shown on the display 171 is suppressed, or squelched when the measured parameter is below a threshold amount. For example, when the power of a signal drops below a level set by a threshold 310, it is not shown on the display 171. The threshold 310 may be fixed or user controlled. The user may set the threshold, such as by controlling one or more of the user interface options in the user interface 170. For instance, the user may indicate the threshold by pressing a button 172, turning a knob 173, or entering a threshold through a keyboard or other means through the communication interface 174. Embodiments that use two thresholds are described with reference to FIG. 6C below.

Figure 5:
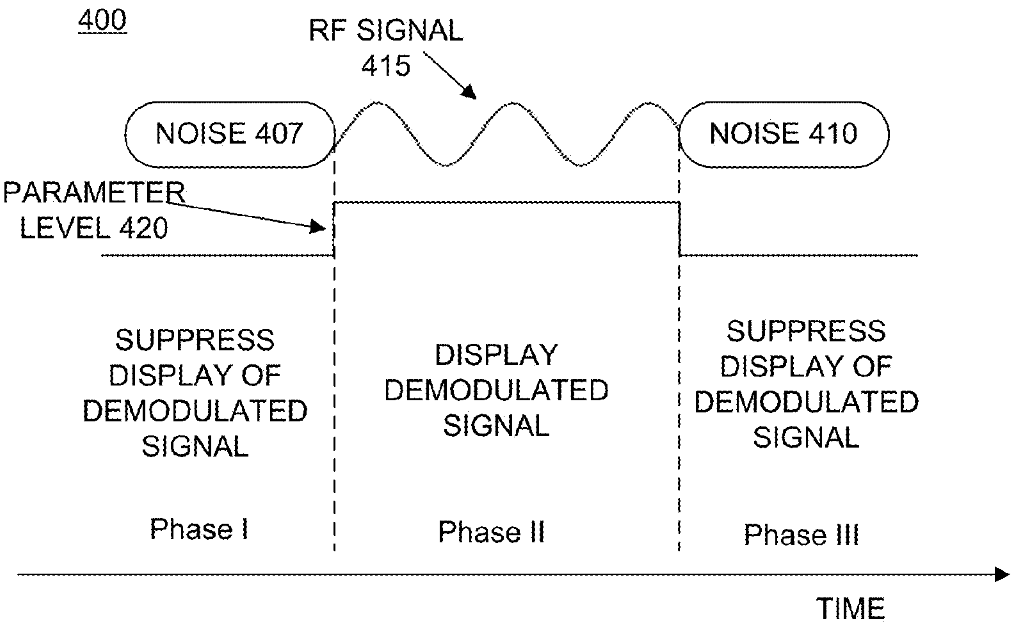
FIG. 5 is a diagram that illustrates how display of information is controlled based on a detected parameter level of a signal according to embodiments of the invention.

FIG. 5 illustrates the example described immediately above. In Phases I and III, an RF signal 415 is not presently carrying data and its de-modulated signal appears as a period of noise 407 and 410, respectively. In the absence of a valid RF signal 415, noise such as 407 or 410 may be present on an input terminal of a signal analyzer. The phase of noise is more noise. Similarly, the frequency of noise is more noise. Only during Phase II is the RF signal 415 carrying a digital signal that can be successfully de-modulated. A measure of a measured parameter 420, such as power, is also illustrated. In Phase I, the power is low, below the set threshold (not shown). In this instance, the output from the comparator 305 from FIG. 4 would be used to suppress display of the demodulated signal, otherwise the demodulated signal would merely show noise on the display 171. In Phase II, the measured power exceeds the threshold and the demodulated signal is shown on the display 171. In Phase III, the power level of the demodulated signal drops below the threshold again, and the demodulated signal is suppressed again. In this manner, a user of a test and measurement device may have a better experience because only important signals are shown on the display.

Figure 6A:
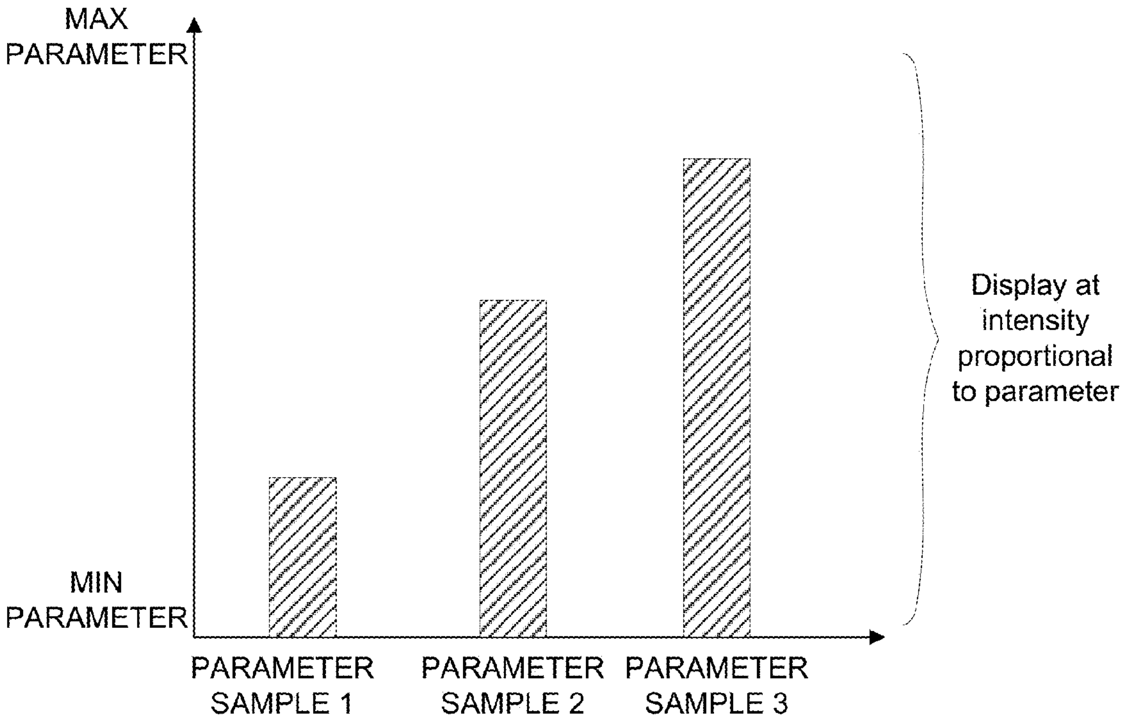
FIG. 6A is a chart that illustrates how various classes of sampled information may be displayed according to embodiments of the invention.
Figure 6B:
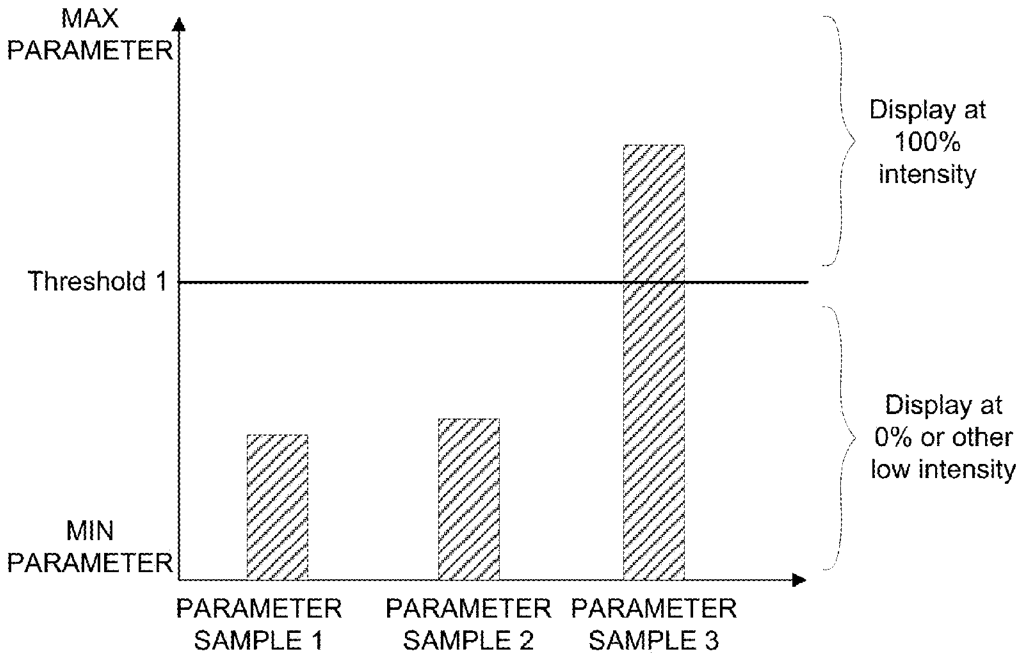
FIG. 6B is a chart that illustrates how various classes of sampled information may be displayed when compared to a threshold according to embodiments of the invention.
Figure 6C:
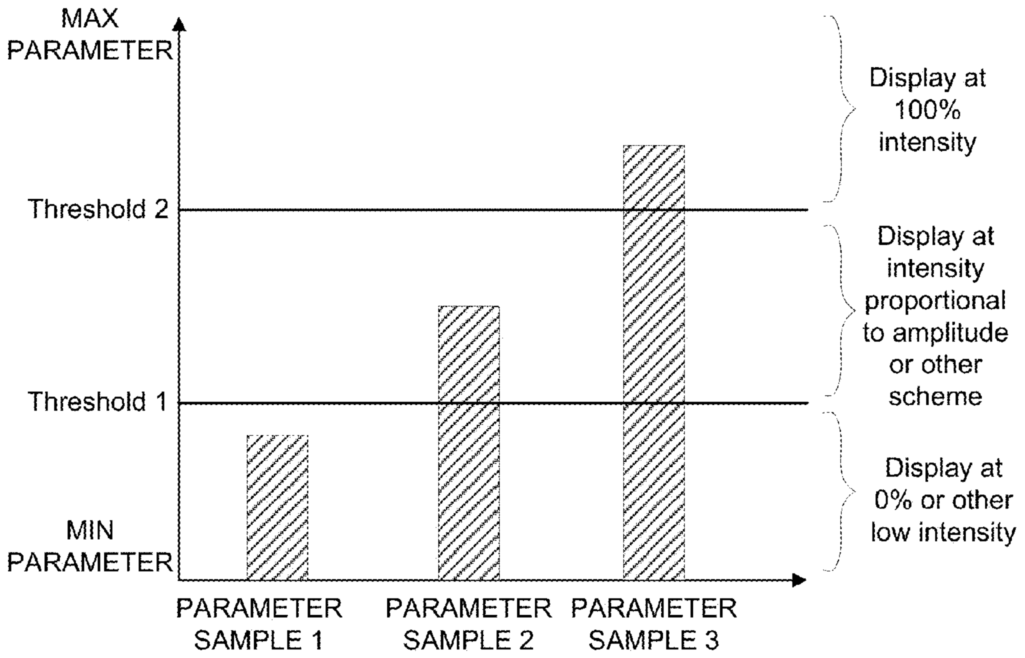
FIG. 6C is a chart that illustrates how various classes of sampled information may be displayed when compared to two thresholds according to embodiments of the invention.

FIGS. 6A, 6B, and 6C show different variations of how data or waveforms may be shown on a display according to embodiments of the invention. The most general case is illustrated in FIG. 6A, which illustrates a measured parameter of data sample 1, data sample 2, and data sample 3. A maximum parameter and minimum parameter is also shown. In this embodiment, data or a waveform is shown on the display that has an intensity proportional to the measured parameter. For example the data point or waveform for sample 3 will be shown with more intensity, that is, brighter, than the data point or waveform for sample 1. The data point or waveform for sample 2 would have an intensity between that of sample 1 and sample 3.

FIG. 6B illustrates the "squelch" embodiment described above. A parameter of each sample, such as amplitude, is compared to a threshold, illustrated here as threshold 1. Samples having an amplitude below the threshold are suppressed or shown at a low intensity, while samples above the threshold would be shown at full or high intensity. Therefore, in this example, data points or waveforms for samples 1 and 2 would be suppressed, because they are below threshold 1, while a data point or waveform for sample 3 would be shown at a high intensity.

FIG. 6C shows embodiments where two thresholds are used, threshold 1 and threshold 2. Samples below threshold 1 are suppressed or shown at low intensity, just as with the example of FIG. 6B. Similarly, samples above threshold 2 are shown at a high intensity. Thresholds 1 and 2 may be user settable or otherwise definable, or they may be pre-set options. Thresholds 1 and 2 may be pre-set at typical minimum and maximum measured values, for instance. Thresholds 1 and 2 could alternatively be automatically set to the minimum and maximum measured values, respectively. Samples having a measured parameter value between the thresholds could be treated in various ways. In one embodiment samples between the thresholds could be displayed with an intensity varying based on the measured parameter. In another embodiment samples between the thresholds could be shown with a middle value, somewhere between the low intensity and high intensity. Other schemata are possible based on the implementation of embodiments of the invention.

Figure 7:
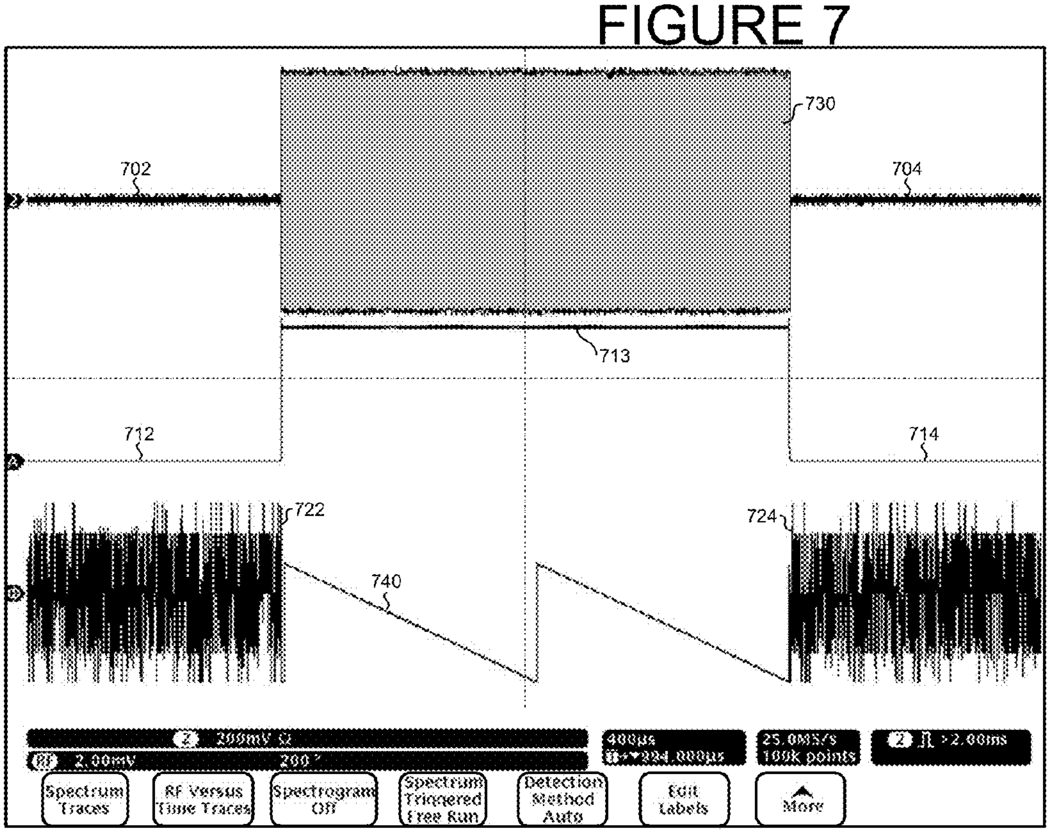
FIG. 7 is a waveform diagram illustrating how information is conventionally displayed on a test and measurement device.
Figure 8:
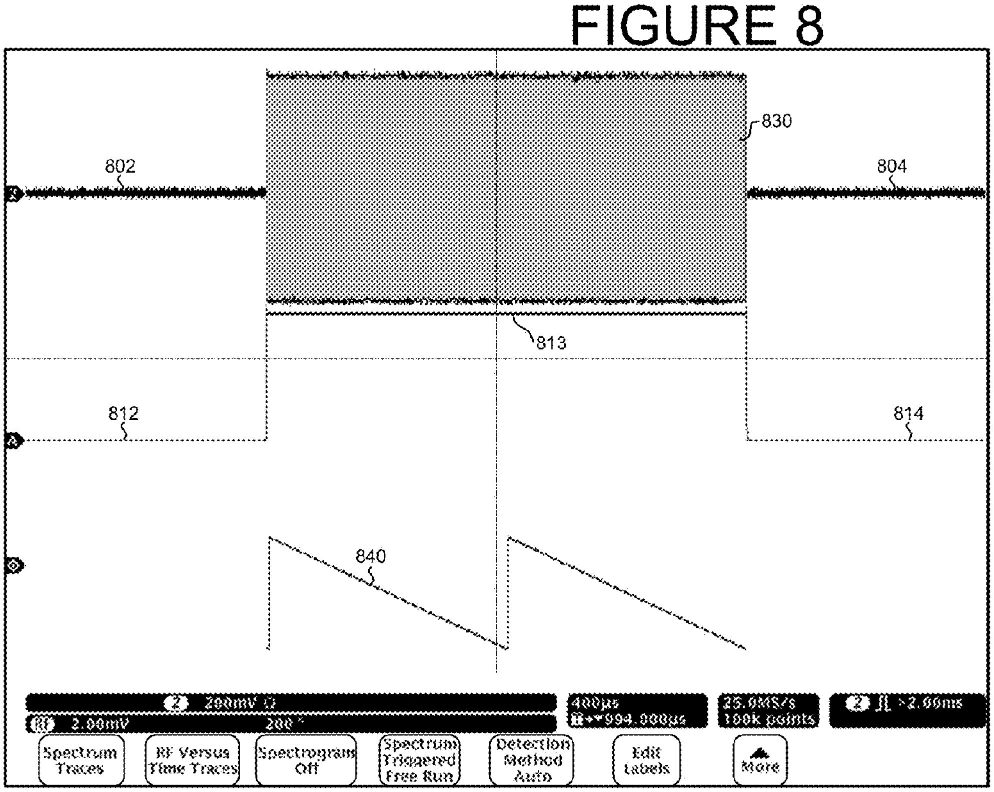
FIG. 8 is a waveform diagram illustrating how information is displayed on a test and measurement device according to embodiments of the invention.

FIGS. 7 and 8 illustrate how embodiments of the invention work in practice, and how beneficial they may be to a user of a test and measurement device. In FIG. 7, a display of a test and measurement instrument is shown. A trace of signal 702 is the display output from an input signal coupled to the input terminal 110 of one of the signal analyzers 100, 102, or 104, for instance. The signal 702 coupled to the input terminal 110 is not presently carrying data, which means the phase demodulation of the signal 702 shows as noise, which is illustrated here as noise 722, near the bottom-left of the display in FIG. 7. In the top-middle portion of the display, a data signal 730 appears, illustrated here as a shaded box. For purposes of illustration, the data signal 730 shown here is a short burst of a 999 kHz sine wave. During times when the data signal 730 is present, an amplitude 713 is much higher than amplitudes 712 and 714. Thus, when the data signal 730 is not present, such as illustrated by traces 702 and 704, the corresponding amplitudes 712 and 714 are relatively low. Conversely, when the data signal 730 is present, the corresponding amplitude 713 is relatively high.

The phase demodulation of the data signal 730 appears as a waveform 740. The waveform 740 is the desired information sought by the user of the measurement device. Specifically, the waveform 740 shows the phase demodulation of the data signal 730 relative to a 1 MHz carrier. The phase demodulation waveform 740 illustrates that over the course of the data burst, the phase of the slower sine wave (999 kHz) falls behind the carrier wave (1 MHz). Eventually, the data burst ends and the data signal 730 goes away, and the trace 704 again informs the user that the input signal is not carrying data. Consequently, noise 724 likewise re-appears, because the phase demodulation 724 of the signal 704 contains noise.

FIG. 8, conversely, illustrates operation of embodiments of the invention that use a threshold value to selectively suppress a waveform display based on a measured parameter. In FIG. 8, the input signal and data burst are the same as present in FIG. 7. Differently in FIG. 8 is that a measured parameter, such as amplitude, is used to selectively determine when to display waveforms or other time-based data. A measured amplitude is illustrated in a first phase as 812, which is below a threshold (not illustrated). Because the measured amplitude is below the threshold, the output waveform from demodulating the input signal, which would normally be present, is suppressed. In other words, compared to FIG. 7 where the noise signal 722 appears, in FIG. 8 there is no corresponding noise signal, because it is suppressed. Then, when the data signal 830 appears, the amplitude 813 rises above the threshold, and the demodulated signal is illustrated on the display as waveform 840. After the data burst is over, the amplitude 814 again drops below the threshold the demodulated signal. This again causes the waveform that would otherwise be shown on the display as noise, for example noise 724 of FIG. 7, to be suppressed in FIG. 8, because the system of FIG. 8 uses embodiments of the invention. Note how much more information is easily conveyed on display of FIG. 8 compared to the display of FIG. 7. In an embodiment that does not use thresholds, but rater intensity values based on amplitude, noise data would appear very faintly, or not at all, during times when the amplitude signal is low, such as during times corresponding to the low amplitude signals of 812 and 814.

Figure 9:
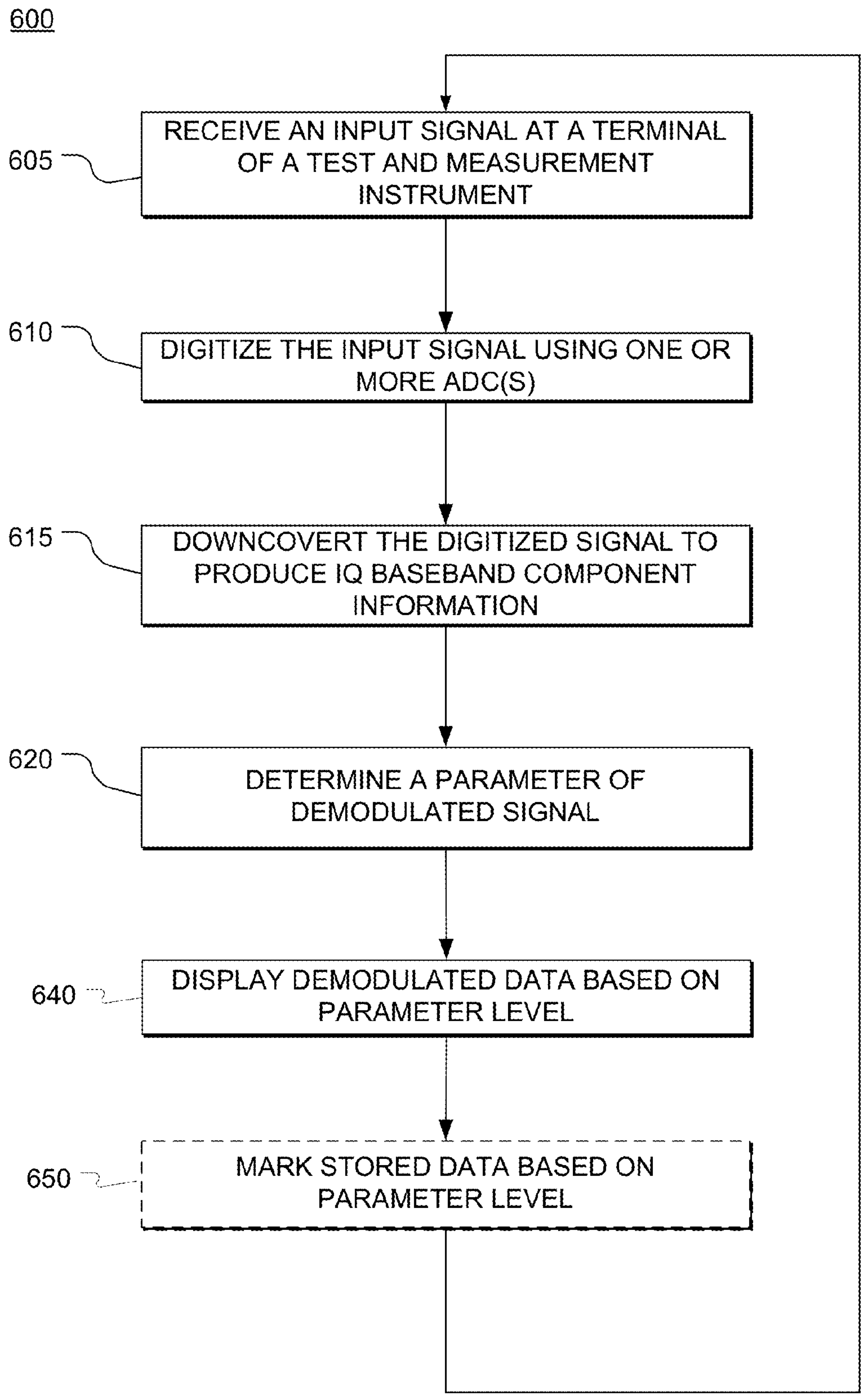
FIG. 9 is a flow diagram illustrating a technique for controlling selective display of information based on a measured parameter according to embodiments of the invention.

FIG. 9 is a flowchart illustrating an example method of operation according to embodiments of the invention. A flow 600 begins with an operation 605 that receives an input signal at an input terminal. The input signal may be an RF signal as described above, or may be any signal from which time-domain waveforms may be derived. A process 610 digitizes the input signal using an analog to digital converter, and a process 615 downconverts the digitized signal to produce I-Q baseband component information.

An operation 620 determines a parameter of a demodulated signal or other parameter that may be used in embodiments of the invention. For example, determining a parameter may include measuring a power level. Other examples may include measuring an amplitude or determining a magnitude, for example.

An operation 640 displays demodulated data based on a parameter level. For example, if the parameter level is below a threshold, the demodulated data may be suppressed, and if it is above the threshold the demodulated data may be shown at a full intensity. In other embodiments the data may be shown at an intensity that is based on the determined parameter. For example data with a high power level may be shown brightly while data at a low power level may be shown less bright. Although embodiments of the invention have been described as being shown with varying intensities, the same or similar concepts could be applied to showing the data or waveforms in various colors as well.

In some embodiments, the parameter level may be used to label or otherwise mark data stored in a test and measurement device. For example, data stored during a non-data-burst may be invalid data, and embodiments of the data may label data stored at such times accordingly.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as “according to an embodiment of the invention” or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

What is claimed is:

1. A test and measurement instrument, comprising:

a signal input structured to receive a modulated radio frequency (RF) signal under test;

a demodulator structured to extract a digital signal from the received modulated RF signal, the digital signal having a measurable parameter; and a display controller structured to display the extracted demodulated signal at one of at least two different intensities based on the measured parameter of the digital signal in which the digital signal carried by the modulated RF signal is a burst-mode data signal, in which the display controller is structured to display the extracted demodulated signal at a high intensity when the burst-mode is active, and is structured to display the extracted demodulated signal at a low intensity when the burst-mode is inactive.

2. The test and measurement instrument of claim 1, in which the demodulator is one of a phase modulator and a frequency modulator.

3. The test and measurement instrument of claim 1, in which measurable parameter of the digital signal is amplitude, and in which the display controller is further structured to display the extracted demodulated signal at an intensity level based on the amplitude of the extracted demodulated signal.

4. The test and measurement instrument of claim 1, in which measurable parameter of the digital signal is power, and in which the display controller is further structured to display the extracted demodulated signal at an intensity level based on the power of the extracted demodulated signal.

5. The test and measurement instrument of claim 1, in which measurable parameter of the digital signal is magnitude, and in which the display controller is further structured to display the extracted demodulated signal at an intensity level based on the magnitude of the extracted demodulated signal.

6. The test and measurement instrument of claim 1, in which the intensity at which the demodulated signal is displayed is zero when the measurable parameter is below a threshold.

7. The test and measurement instrument of claim 6, in which the display controller is structured to display the extracted demodulated signal at a full intensity level when the amplitude of the demodulated signal is above the threshold.

8. The test and measurement instrument of claim 1 in which the display controller is structured to display the extracted demodulated signal at a varying intensity level when the amplitude of the demodulated signal is between a first measured parameter and a second measured parameter.

9. The test and measurement instrument of claim 1, further comprising:

a memory for storing data retrieved from the extracted demodulated signal.

10. The test and measurement instrument of claim 9 in which the data in the memory is indicated as not containing valid data when the measured parameter of the demodulated signal is below a threshold.

11. A test and measurement instrument, comprising:

a signal input structured to receive a modulated signal to be evaluated;

a demodulator structured to extract a time-dependent signal from the modulated signal to be evaluated, the time-dependent signal having a measurable parameter; and a display controller structured to display the time-dependent signal at one of at least two different intensities based on the measured parameter of the time-dependent signal, in which the time-dependent signal carried by the modulated signal is a burst-mode data signal, in which the display controller is structured to display the extracted demodulated signal at a high intensity when the burst-mode is active, and is structured to display the extracted demodulated signal at a low intensity when the burst-mode is inactive.

12. The test and measurement instrument of claim 11, in which measurable parameter of the time-dependent signal is amplitude, and in which the display controller is further structured to display the extracted time-dependent signal at an intensity level based on the amplitude of the extracted time-dependent signal.

13. The test and measurement instrument of claim 11, in which measurable parameter of the time-dependent signal is power, and in which the display controller is further structured to display the extracted time-dependent signal at an intensity level based on the power of the extracted time-dependent signal.

14. The test and measurement instrument of claim 11, in which measurable parameter of the time-dependent signal is magnitude, and in which the display controller is further structured to display the extracted time-dependent signal at an intensity level based on the magnitude of the extracted time-dependent signal.

15. A method in a test and measurement device, the method comprising:

receiving a modulated input signal at the test and measurement device;

demodulating the modulated input signal during a burst mode to extract a time-dependent data signal;

determining a parameter of the time-dependent data signal; and selectively displaying the time-dependent data signal one of two or more intensity levels dependent on the determined parameter level, in which the time-dependent data signal is displayed at a first intensity when the burst-mode is active, and is displayed at a second intensity when the burst-mode is inactive, the first intensity different than the second intensity.

16. The method of claim 15 in which the test and measurement device further comprises a memory for storing data, the method further comprising:

indicating that data in the memory is invalid when the parameter level is below a threshold level.

17. The method of claim 15 in which the demodulated data suppressed from being displayed when the parameter level of the time-dependent data signal is below a threshold level.

* * * * *